(12) United States Patent
Gomi (10) Patent No.: US 7,896,514 B2
(45) Date of Patent: Mar. 1, 2011

(54) LIGHT EMITTING DEVICE AND DISPLAY DEVICE USING SAME

(75) Inventor: Shuji Gomi, Chiba (JP)

(73) Assignee: Showa Denko K.K., Tokyo (JP)

( * ) Notice: Subject to any disclaimer, the term of this patent is extended or adjusted under 35 U.S.C. 154(b) by 99 days.

(21) Appl. No.: 12/374,151

(22) PCT Filed: Jul. 13, 2007

(86) PCT No.: PCT/JP2007/063993

§ 371 (c)(1),
(2), (4) Date: Jan. 16, 2009

(87) PCT Pub. No.: WO2008/013072

PCT Pub. Date: Jan. 31, 2008

(65) Prior Publication Data

US 2009/0257215 A1   Oct. 15, 2009

(30) Foreign Application Priority Data

Jul. 25, 2006   (JP)   ................. 2006-201842

(51) Int. Cl.
*G09F 13/08*   (2006.01)
(52) U.S. Cl. .................. 362/97.3; 362/800; 362/612; 362/613; 362/97.1; 362/97.4
(58) Field of Classification Search ............... 362/800, 362/612, 613, 97.1–97.4, 249.02, 362
See application file for complete search history.

(56) References Cited

U.S. PATENT DOCUMENTS 7,470,046 B2 * 12/2008 Kao et al. ................ 362/332

| | | |
|---|---|---|
| 2005/0023545 A1 | 2/2005 | Camras et al. |
| 2005/0138852 A1 | 6/2005 | Yamauchi |
| 2006/0118805 A1 | 6/2006 | Camras et al. |
| 2006/0232964 A1 * | 10/2006 | Hoshi et al. ............. 362/231 |
| 2009/0080179 A1 * | 3/2009 | Takata .................. 362/97.1 |
| 2010/0073911 A1 * | 3/2010 | Ohkawa ................. 362/97.1 |

FOREIGN PATENT DOCUMENTS

| | | |
|---|---|---|
| JP | 2002-170402 A | 6/2002 |
| JP | 2004-006317 A | 1/2004 |
| JP | 2004-111189 A | 4/2004 |
| JP | 2005-057266 A | 3/2005 |
| JP | 2005-108675 A | 4/2005 |
| JP | 2005-214790 A | 8/2005 |

* cited by examiner

*Primary Examiner*—Anabel M Ton
(74) *Attorney, Agent, or Firm*—Sughrue Mion, PLLC (57) ABSTRACT

A light emitting device is provided with an LED substrate (mounting substrate) (12); a plurality of light-emitting diodes (LEDs) (21) mounted on the LED substrate (12); and a reflector (50), which is mounted on the LED substrate (12), has a first surface (52*a*), and a second surface (52*b*) having a front-rear relationship with the first surface (52*a*), reflects light emitted from one light-emitting diode (LED) (21) of the light-emitting diodes (LEDs) (21) by the first surface (52*a*), and reflects light from the light-emitting diode (LED) (21) adjacent to the one light-emitting diode (LED) (21) by the second surface (52*b*). Thus, in a backlight device using a solid-state light emitting element, such as a LED, luminance is made uniform by reducing luminance nonuniformity.

19 Claims, 9 Drawing Sheets

LIGHT EMITTING DEVICE AND DISPLAY DEVICE USING SAME

TECHNICAL FIELD

The present invention relates to a large variety of light-emitting devices typified by a backlight device such as a liquid crystal display device, for example, also relates to a display device using the light-emitting device, and the like.

BACKGROUND ART

Recently, display devices such as liquid crystal display devices, typified by, for example, a liquid crystal display television and a liquid crystal display monitor, have adopted a backlight as a light-emitting device for emitting light from the back, side or the like of a display panel. As the backlight, there is what is called a direct-lighting type in which a light source is disposed on a plane surface beneath the liquid crystal panel (a rear surface), for example. In addition, what is called an edge-lighting type exists in which a light source is disposed on two or one side of a light guide plate made of a transparent resin so that light incident on the light guide plate is reflected by a reflector disposed on the back surface of the light guide plate, and illuminates, for example, the surface of a liquid crystal display panel. Here, the direct-lighting type has an advantage of securing high brightness, but has a disadvantage of difficulty in achieving a thinner backlight. On the other hand, the edge-lighting type has an advantage of achieving a thinner backlight than the direct-lighting type, but has a disadvantage of difficulty in obtaining uniformity in the luminance for a large display.

A fluorescent tube such as a hot-cathode fluorescent tube or a cold-cathode fluorescent tube is widely used as the above-mentioned backlight device. On the other hand, technologies of backlight devices using light-emitting diodes (LEDs), which are one type of solid-state light-emitting elements, as a light source, have been recently developed as a substitute for the backlight devices using the fluorescent tubes.

Here, the backlight device is generally provided with a reflection plate (a reflector) configured to reflect light emitted from, for example, the LED toward, for example, an observer.

The related art disclosed in a Patent Official Gazette includes a technique that involves: the provision of a light guide plate having a light exit surface, a reflecting surface and a light entrance surface; the provision of a bottom plate and a sidewall under the light guide plate; the disposition of plural light-emitting diodes on the bottom plate; and the use of the sidewall as the reflecting surface (see Patent Document 1, for example). This Patent Document discloses that a film, sheet or the like made of resin such as white PET (polyethyleneterephthalate) or formed by a plating deposition of metal such as silver or aluminum is used, giving a specular reflection or high-reflectivity function to the sidewall in order to reflect light emitted from the light-emitting diodes.

Also, another Patent Official Gazette discloses a light emitting device provided with a reflector adapted to direct light toward the top face of an optical component in order to improve light extraction efficiency (see Patent Document 2, for example).

Patent Document 1: Japanese Patent Application Laid Open Publication No. 2005-108675

Patent Document 2: Japanese Patent Application Laid Open Publication No. 2005-57266

DISCLOSURE OF THE INVENTION

Problems to be Solved by the Invention

The light-emitting diodes (LEDs), as adopted here, for example, as the direct-lighting type backlight for the liquid crystal display panel, are arranged, for example, in rows (in two-dimensional arrays) on the underside of a casing to form a surface light source. Such rows (two-dimensional arrays) are often formed, for example, lengthwise and widthwise at predetermined spaced intervals. Then, a diffusion plate or a prism sheet is typically formed at a distance on the order of 1 to 5 cm from the light-emitting diodes (LEDs) in the direction of the liquid crystal display panel.

Then, when the light-emitting diodes (LEDs) are driven to emit light, the emitted light travels directly to the diffusion plate or bounces off the reflector (a reflecting sheet) and sent to the diffusion plate. Thereafter, the light undergoes irregular reflections in the diffusion plate, and then, the light rays travel through the prism sheet and thus the light rays perpendicularly enter the liquid crystal display panel. At this time, light beams emitted from different light-emitting diodes (LEDs) are mixed together in the space formed between the light-emitting diodes (LEDs) and the diffusion plate, and further undergo irregular reflections in the diffusion plate, so that their mixing is promoted. This makes luminance and chromaticity uniform. Also, the diffusion plate generally has high luminance in a portion directly above the light-emitting diodes (LEDs), and therefore, the degree of diffusion in this portion is enhanced by using the diffusion plate for improving uniformity in the luminance.

However, the conventional device having the surface light source has a problem as given below: the device is still high in luminance in the portion directly above the light-emitting diodes (LEDs), although the diffusion plate is provided and also disposed at a given distance from the light-emitting diodes (LEDs) in order to render the luminance and the chromaticity uniform, as mentioned above. In particular, the use of multi-color (e.g., RGB) light-emitting diodes (LEDs), rather than monochromatic light-emitting diodes (LEDs), for color mixing leads to a problem as given below: inadequate color mixing takes place, and, in some cases, an unevenness of color may possibly develop. Methods for reducing the occurrence of nonuniformity in the luminance or the unevenness of color include enhancing the degree of diffusion of the diffusion plate in the portion directly above the light-emitting diodes (LEDs), and providing a lighting curtain for partial light shielding; however, these approaches lead to a decrease in the efficiency of light utilization. Also, the methods include the approach of further increasing the distance between the light-emitting diodes (LEDs) and the diffusion plate; however, this approach leads to an increase in the thickness of the surface light source device.

The present invention has been made in order to address the above technological problems. An object of the present invention is to provide a light emitting device using a solid-state light-emitting element such as an LED, and, by using such a device, capable of reducing nonuniformity in the luminance to achieve uniformity in the luminance.

An other object of the present invention is to provide a light emitting device and a display device capable of contributing to any one of thickness reduction, weight reduction, and cost reduction of the devices.

Still another object of the present invention is to provide a light emitting device and a display device excellent in heat radiation characteristics.

Means for Solving the Problems

In order to attain the above objects, according to one feature of the present invention, there is provided a light emitting device such as a direct-lighting type backlight device for use in a display device, in which light emitted from a luminous source disposed directly under a liquid crystal display panel is laterally reflected to achieve good light diffusion and color mixing. That is to say, a light emitting device to which the present invention is applied has a mounting substrate, a plurality of solid-state light-emitting elements that are mounted on the mounting substrate and a reflector. The reflector is mounted on the mounting substrate, has a first surface and a second surface opposite to the first surface, causes the first surface to reflect light emitted from any one of the plurality of solid-state light-emitting elements, and causes the second surface to reflect light from an adjacent one of the plurality of solid-state light-emitting elements to the one of the plurality of solid-state light-emitting elements.

Here, the reflector has a mounting portion for mounting the reflector so as to face a surface of the mounting substrate, and a bending portion that is bent from the mounting portion to form the first surface and the second surface.

The reflector has the bending portion corresponding to each of the plurality of solid-state light-emitting elements.

Moreover, the first surface of the reflector is disposed vertically above each of the plurality of solid-state light-emitting elements, when the mounting substrate is taken as a horizontal surface and the plurality of solid-state light-emitting elements is arranged so as to emit light upward. Then, it is preferable, for example, in a point to be able to reduce the luminance directly above the light source.

According to another aspect of the present invention, a light emitting device to which the present invention is applied has a mounting substrate, a solid-state light-emitting element that is mounted on the mounting substrate and a reflector. The reflector has a mounting portion for mounting the reflector so as to face a surface of the mounting substrate and a bending portion bent from the mounting portion and disposed in a location so as to directly receive and reflect light from the solid-state light-emitting element. In addition, the reflector reflects the light emitted from the solid-state light-emitting element.

The bending portion is formed by cutting and bending up a part of the reflector, and the mounting portion is formed from an uncut part of the reflector. The reflector is mounted on the surface of the mounting substrate directly or with a different material interposed in between.

Further, the bending portion of the reflector has a first surface that directly receives and reflects light emitted from any one of a plurality of the solid-state light-emitting elements, and a second surface that receives and reflects light emitted from another one of the plurality of solid-state light-emitting elements adjacent to the one of the plurality of solid-state light-emitting elements.

Furthermore, the bending portion of the reflector has a first surface that directly receives and reflects light emitted from solid-state light emitting elements in a first row of a plurality of the solid-state light-emitting elements, and a second surface that receives and reflects light emitted from solid-state light emitting elements in a second row in the plurality of solid-state light-emitting elements, the second row being adjacent to the first row. Then, it is excellent in a point to be able to simplify the structure of the reflector.

On the other hand, according to a further aspect of the present invention, there is provided a display device including a display panel that displays an image and a backlight that is disposed on a back side of the display panel and that irradiates the display panel with light from the back side of the display panel. The backlight has a plurality of solid-state light-emitting elements and a reflector. The reflector has a first surface and a second surface opposite to the first surface, causes the first surface to reflect light emitted from any one of the plurality of solid-state light-emitting elements, and causes the second surface to reflect light from an adjacent one of the plurality of solid-state light-emitting elements to the one of the plurality of solid-state light-emitting elements.

Here, the reflector has a mounting portion for mounting the reflector so as to face a surface of the mounting substrate, and a bending portion that is bent from the mounting portion to form the first surface and the second surface.

The reflector has the bending portion corresponding to each of the plurality of solid-state light-emitting elements.

The backlight further has a mounting substrate on which the plurality of solid-state light-emitting elements is mounted. The reflector covers the solid-state light emitting elements at least in a vertical direction from a surface of the mounting substrate, and forms the first surface and the second surface at a certain angle with respect to any one of the surface of the mounting substrate and a plane parallel to the mounting substrate. The certain angle particularly lies between 10 and 45 degrees inclusive.

The first surface and the second surface of the reflector are disposed corresponding to each of the plurality of solid-state light-emitting elements. The light reflected on the second surface is light emitted from the adjacent one of the plurality of solid-state light-emitting elements and reflected on a first surface of another reflector adjacent to the reflector. Then, even though color mixing occurs, for example, with double length (length of an optical path) for pitch between solid-state light-emitting elements adjacent to each other as a light source, this configuration is preferable in a point that the necessary length of an optical path is secured.

Moreover, the first surface of the reflector directly receives and reflects light from solid-state light-emitting elements in a certain row of the plurality of solid-state light-emitting elements.

Advantages Of The Invention

According to the present invention having the above-mentioned configuration, it is possible to reduce nonuniformity in the luminance and to achieve uniformity in the luminance with the light emitting device using a solid-state light-emitting element such as an LED.

BEST MODES FOR CARRYING OUT THE INVENTION

Hereinafter, exemplary embodiments of the present invention will be described in detail with reference to the accompanying drawings.

Figure 1:
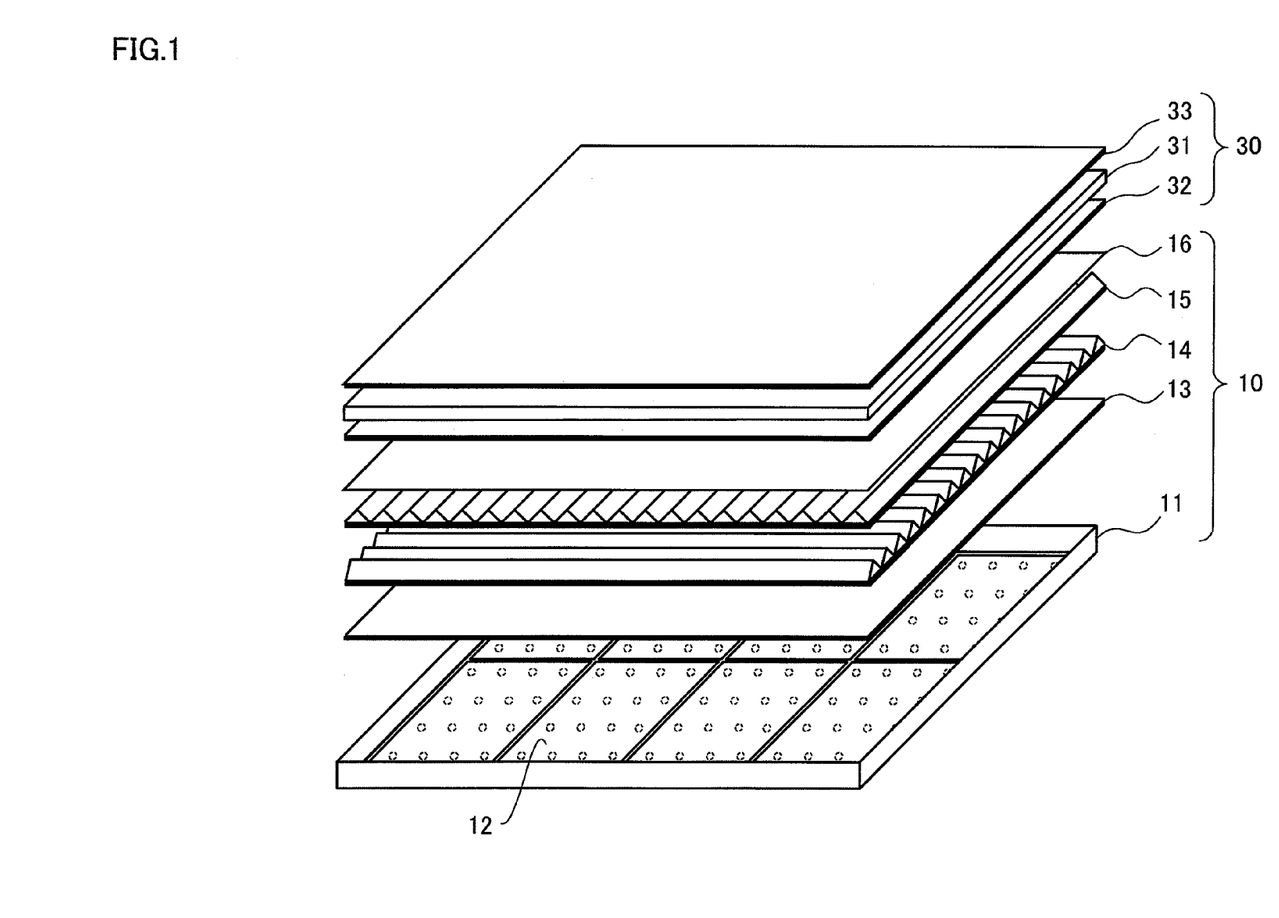
FIG. 1 is an entire configuration of a liquid crystal display device to which an exemplary embodiment is applied.

FIG. 1 is an entire configuration of a liquid crystal display device to which an exemplary embodiment is applied. The liquid crystal display device to which the present exemplary embodiment is applied, as a direct lighting type backlight device (backlight) 10, includes a backlight frame 11 that contains a light-emitting portion, and a LED substrate (mounting substrate) 12 as a substrate on which plural light-emitting diodes (LEDs) that are one type of a solid-state light-emitting element as a light-emitting source are arrayed. Moreover, the backlight device 10 includes, as a laminate of optical films, a diffusion plate 13 which is a transparent plate for scattering and diffusing light to equalize the lightness over the entire surface, and prism sheets 14 and 15 as a diffraction grating film that has a light collection effect to the front. A diffusion film may further be set on the diffusion plate 13. The backlight device 10 includes a brightness improvement film 16 with a diffusion and reflection type, for improving the brightness. Furthermore, the liquid crystal display module 30 includes a liquid crystal panel 31 that is configured by two glass plates sandwiching liquid crystal in between, and polarization plates (polarization filters) 32 and 33 for restricting the oscillation of optical wave to a given direction, which are each laminated on each glass plate of the liquid crystal panel 31. The liquid crystal display device includes peripheral members (not shown in the figure) such as an LSI (Large Scale Integration) for driving.

The liquid crystal panel 31 includes various components not shown in the figure. For example, the two glass plates have display electrodes, active elements such as a thin film transistor (TFT), liquid crystal, a spacer, sealant, an orientation film, a common electrode, a protective film, a color filter, and others, none of which is shown in the figure.

Incidentally, the structural unit of the backlight device 10 is selected in an arbitrary way. For example, the unit including only the backlight frame 11 with the LED substrate 12 may be called as the "backlight device (backlight)" and distributed so as not to include the laminate of the optical films such as the diffusion plate 13 and the prism sheets 14 and 15.

Figure 2:
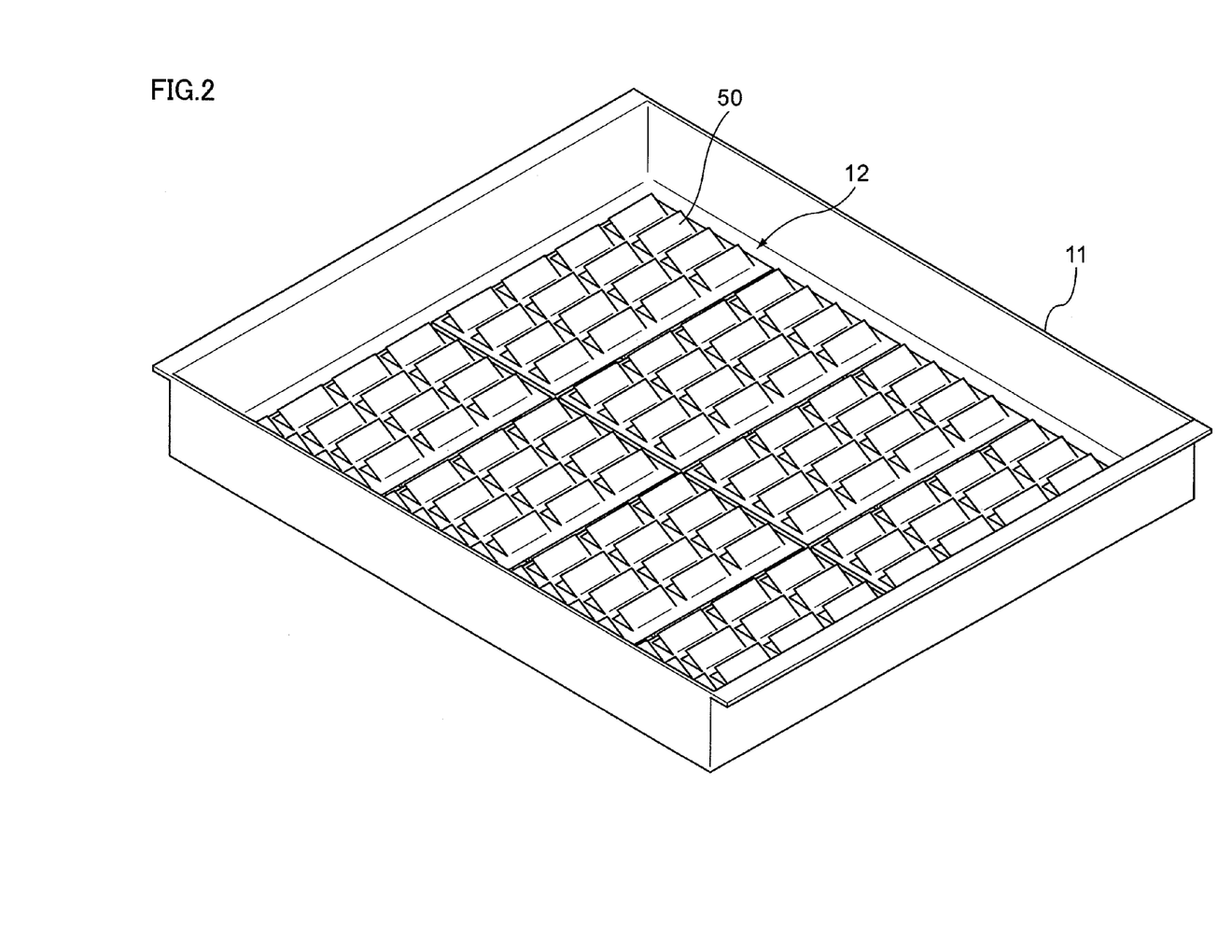
FIG. 2 is a view for explaining a partial structure of the backlight device.

FIG. 2 is a view for explaining a partial structure of the backlight device 10 as a light emitting device. In an instance shown in FIG. 2, a direct-lighting type backlight configuration is adopted in which light sources are disposed directly beneath the rear of the liquid crystal display module 30. In this backlight configuration, LED chips are arrayed in such a manner that they are almost uniformly distributed over the entire rear surface of the liquid crystal display module 30. This is different from what is called a side-lighting type in which light sources are placed along one or two sides of a light guide plate and uniform light on a plane surface is obtained by a reflecting plate, the light guide plate and the like.

The backlight frame 11 has a casing structure made of, for example, aluminum, magnesium, iron, or a metallic alloy including these materials. For example, a polyester film or the like having a high performance of reflecting white light adheres to the inside of the casing structure. It also functions as a reflector. The casing structure is composed of a rear portion corresponding to the size of the liquid crystal display module 30 and side portions enclosing the four sides of the rear portion. On the rear portion or the side portions, a heat sink configuration including a cooling fin for exhaust heat may be provided as necessary.

In the instance shown in FIG. 2, plural LED substrates 12 (eight as employed in FIG. 2) are provided, and each of the LED substrates 12 is fixed to a backlight frame 11 by plural screws (not shown in the figure). Also, the LED substrates 12 are each provided with a reflector 50 having a configuration characteristic of the present exemplary embodiment. The reflector 50 is mounted on the LED substrates 12 so that the bending direction of a bending portion (to be described later) is the same. A double-sided tape, an adhesive, a solder reflow, a screw or the like is used for mounting of the reflector 50.

Figure 3:
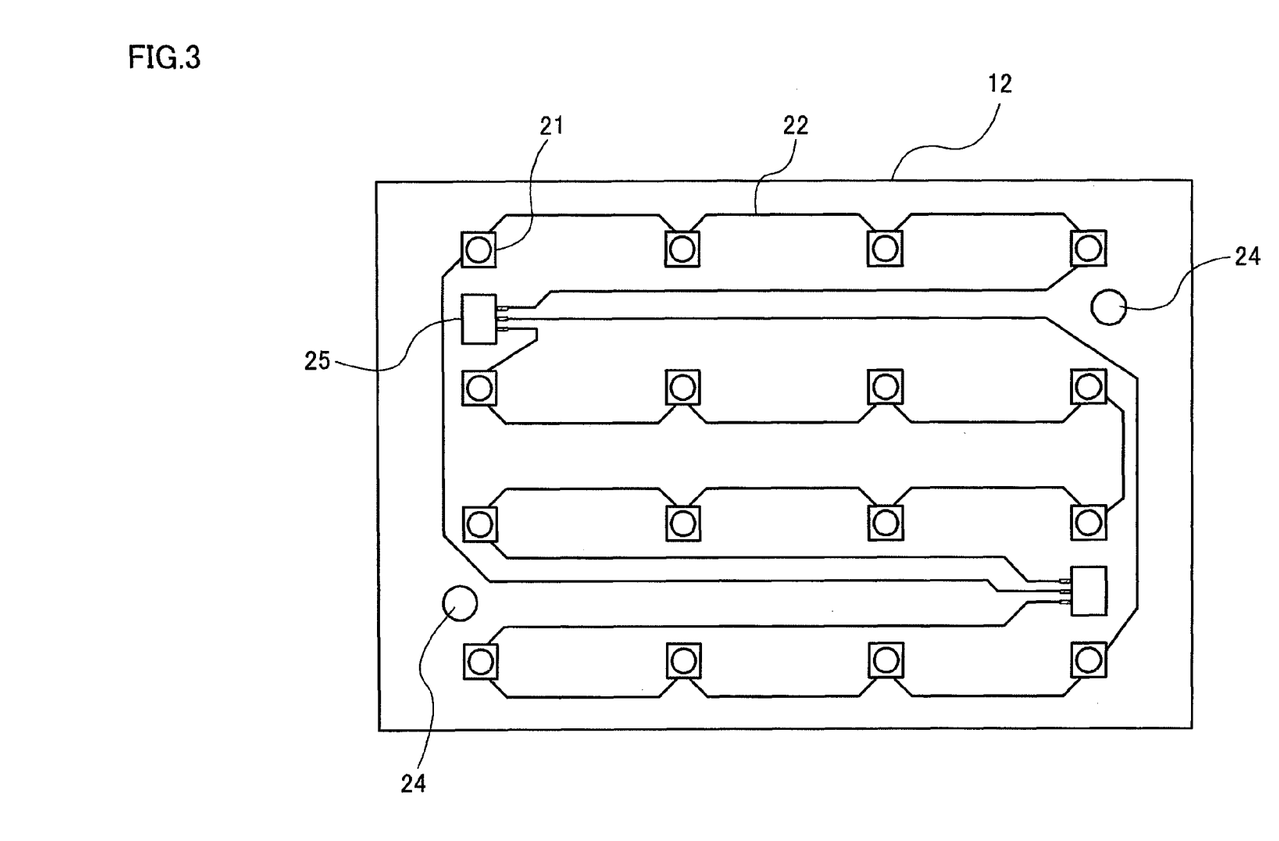
FIG. 3 is a view of assistance in explaining the structure of the LED substrate with the reflector not mounted thereon.

FIG. 3 is a view of assistance in explaining the structure of the LED substrate 12 with the reflector 50 not mounted thereon. Plural light-emitting diodes (LEDs) 21 are mounted on the LED substrate 12 shown in FIG. 3, and each of them forms a package. Also, the LED substrate 12 is provided with a wiring circuit 22 for supplying a drive current to the light-emitting diodes (LEDs) 21, and with penetration hole portions 24 for fixing of the screws. Further, the LED substrate 12 includes a terminal 25 for supplying the drive current to the light-emitting diodes (LEDs) 21. The wiring circuit 22 is made of, for example, copper or a copper-base metal material, and the light-emitting diodes (LEDs) 21 mounted on the LED substrate 12 are electrically connected to the wiring circuit 22. A surface on which the wiring circuit 22 is formed is given a white resist process, and a reflectance of, for example, 80% or more is ensured. Incidentally, the wiring circuit 22 shown in FIG. 3 does not reflect actual wiring and is not necessarily accurate one. Also, for example, a wiring circuit disposed under a package of the light-emitting diodes (LEDs) 21 and the like is omitted from FIG. 3.

The plural light-emitting diodes (LEDs) 21 are formed out of red LEDs emitting red light, green LEDs emitting green light, and blue LEDs emitting blue light, and the red, green and blue (RGB) LEDs are disposed on the LED substrates 12 in accordance with a given rule. By mixing light beams from the RGB LEDs (or equivalently, color mixing), a light source having a wide range of color reproducibility can be achieved. Then, the plural LED substrates 12 are mounted on the backlight frame 11, and thereby, the light-emitting diodes (LEDs) 21 are uniformly disposed in the overall backlight structure. This enables providing a backlight device capable of achieving uniform luminance and chromaticity, by using all of the light-emitting diodes (LEDs) 21 present on the backlight frame 11. Incidentally, in the instance shown in FIG. 2, the plural LED substrates 12 are provided; however, one LED substrate 12 may be adopted on which all light-emitting diodes (LEDs) 21 to be used as the light source for the backlight are collectively formed.

Description will now be given with regard to the reflectors 50 mounted on the LED substrates 12.

Figure 4A:
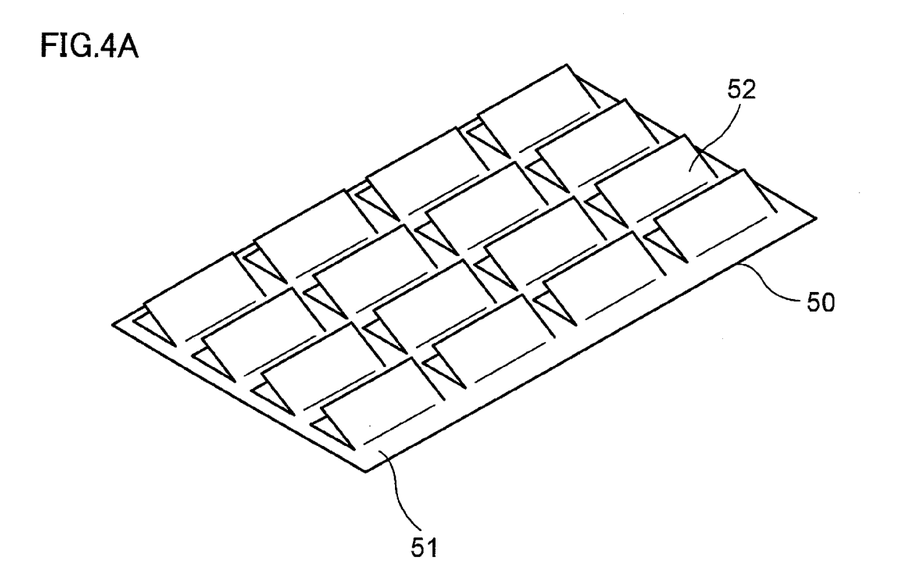
FIGS. 4A and 4B are views showing examples of the reflector to which the exemplary embodiment is applied.
Figure 4B:
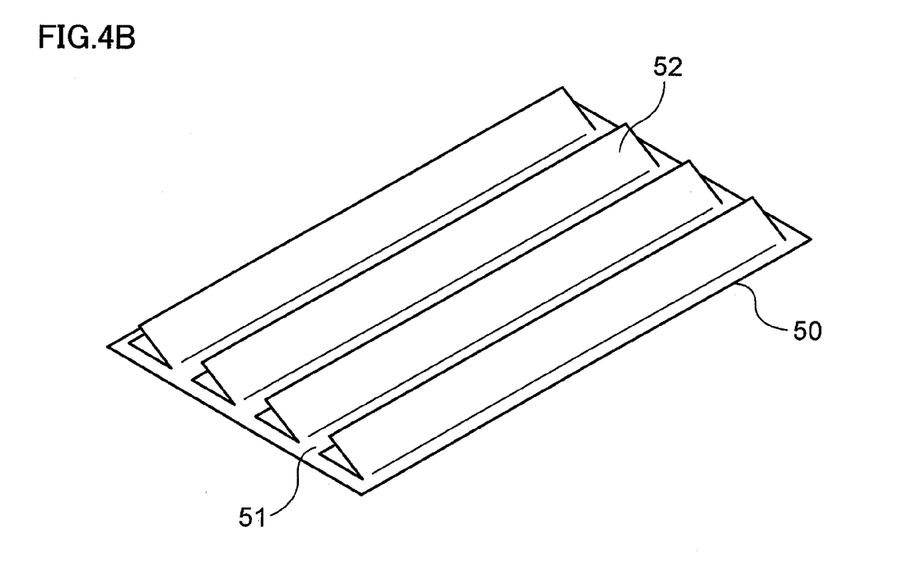

FIGS. 4A and 4B are views showing examples of the reflector 50 to which the exemplary embodiment is applied. The reflector 50 shown in the figures is formed, for example, by processing a thin sheet of phosphor bronze of about 0.3 mm thick. Also, the reflector 50 may be made of a thin sheet of aluminum, magnesium, iron, a metallic alloy including these materials, or the like. The reflector 50 includes a mounting portion 51 for mounting the reflector 50 in a manner facing a surface of the LED substrate 12 being a mounting substrate, and a bending portion 52 forming first and second faces, to be described later, by cutting and bending the mounting portion 51. An uncut portion is the mounting portion 51. In the instance shown in FIG. 4A, the bending portion 52 is provided for each set of light-emitting diodes (LEDs) 21. On the other hand, in the instance shown in FIG. 4B, the bending portion 52 is provided for each row.

Desirably, the bending portion 52, after bent, has a reflectance of, for example, 90% or more on both surfaces (namely, the first and second surfaces to be described later). Also, the reflectors to be formed on both surfaces may be formed by a deposition of aluminum or the like; however, attachment of an aluminum tape may substitute for the deposition. Also, the reflectors may be formed by plating or by coating white ink. Preferably, a bending angle lies between 10 to 45 degrees, or more preferably, the bending angle is 45 degrees in order to improve reflection efficiency. A bending angle less than 10 degrees is not desirable because the reflection efficiency is reduced. On the other hand, it is preferable that the bending angle is reduced in order to reduce the thickness of the light emitting device. Therefore, the optimum angle is determined by the tradeoff between the thickness reduction of the device and the reflection efficiency. Incidentally, as described in detail later, the configuration is such that a part of each bending portion 52 of the reflector 50 covers the light-emitting diodes (LEDs) 21 disposed on the LED substrate 12 (as placed horizontally) vertically upward.

Figure 5A:
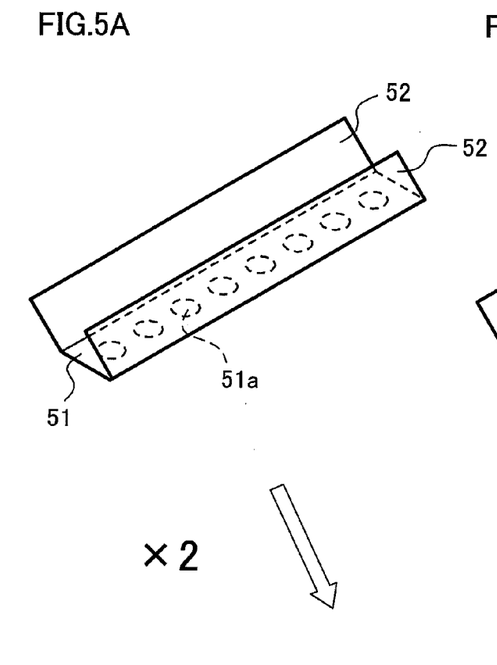
FIGS. 5A to 5C are views showing other examples of the reflector to which the exemplary embodiment is applied.
Figure 5B:
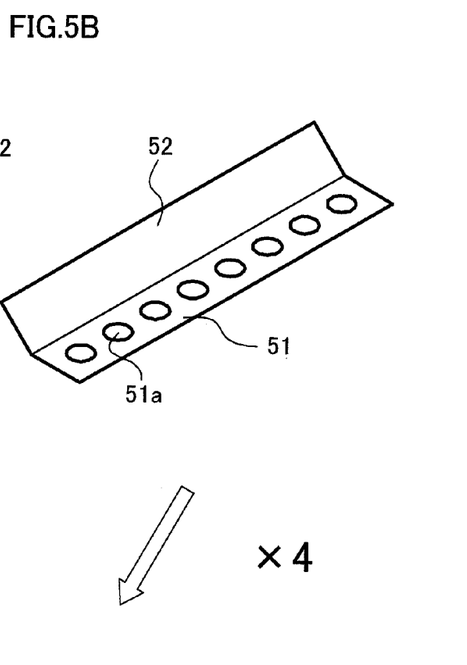
Figure 5C:
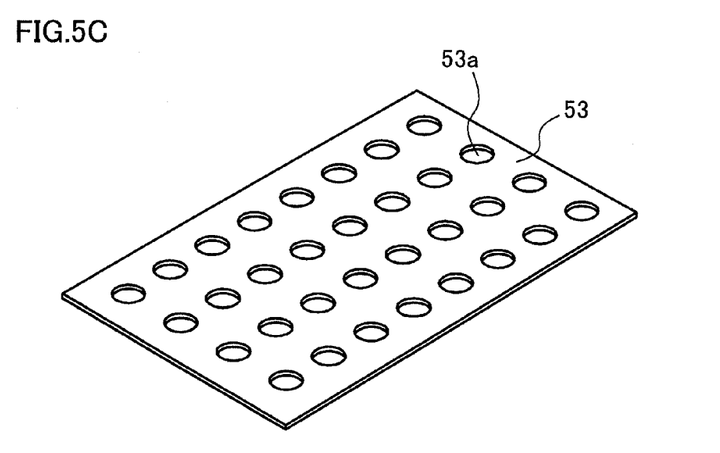

FIGS. 5A to 5C are views showing other examples of the reflector 50. These examples of the reflector 50 are adapted for the LED substrate 12 on which the 4 by 8 light-emitting diodes (LEDs) 21 are arranged, as distinct from the structure shown in FIG. 3. FIG. 5C shows a middle plate 53, and the middle plate 53 is provided with middle plate hole portions 53a for passing light from the light-emitting diodes (LEDs) 21 when the middle plate 53 is mounted on the LED substrate 12. Two plates shown in FIG. 5A or four plates shown in FIG. 5B may be laid on top of the middle plate 53 to form the reflector 50 having substantially the same function as the reflector 50 shown in FIG. 4B.

More specifically, in FIG. 5A, the plate is concavely bent at a predetermined angle so as to be provided with the bending portions 52 at both end sides of the bent plate, and with the mounting portion 51 at the center thereof. The mounting portion 51 is provided with hole portions 51a for passing light from the light-emitting diodes (LEDs) 21 when the mounting portion 51 is mounted on the LED substrate 12 with the middle plate 53 as a different member in between. Also, in FIG. 5B, the plate is bent in an L shape at an internal angle of 135 degrees (180 degrees minus 45 degrees) to 170 degrees (180 degrees minus 10 degrees) to form the mounting portion 51 and the bending portion 52. As in the case of FIG. 5A, the mounting portion 51 is provided with hole portions 51a for passing light from the light-emitting diodes (LEDs) 21 when the mounting portion 51 is mounted on the LED substrate 12 with the middle plate 53 as the different member in between.

If the plate shown in FIG. 5A and the middle plate 53 shown in FIG. 5C are used to form the reflector 50, two plates shown in FIG. 5A are used, and the mounting portions 51 shown in FIG. 5A are attached to the middle plate 53, at an interval of a row of the middle plate 53 shown in FIG. 5C, that is, attached every two rows.

If the plate shown in FIG. 5B and the middle plate 53 shown in FIG. 5C are used to form the reflector 50, four plates shown in FIG. 5B are used, and the mounting portion 51 of each of the plates shown in FIG. 5B are attached to the middle plate 53 for each row. Here, the hole portions 51a and the middle plate hole portions 53a are aligned thereby to prevent cutoff of light from the light-emitting diodes (LEDs) 21 mounted on the LED substrate 12. A double-sided tape, an adhesive, a solder reflow, vacuum brazing or the like is used for the bonding of the middle plate 53 shown in FIG. 5C and the plates shown in FIG. 5A or 5B.

Incidentally, the plates shown in FIG. 5A or 5B may be mounted directly on the LED substrate 12 without the use of the plate shown in FIG. 5C.

Figure 6A:
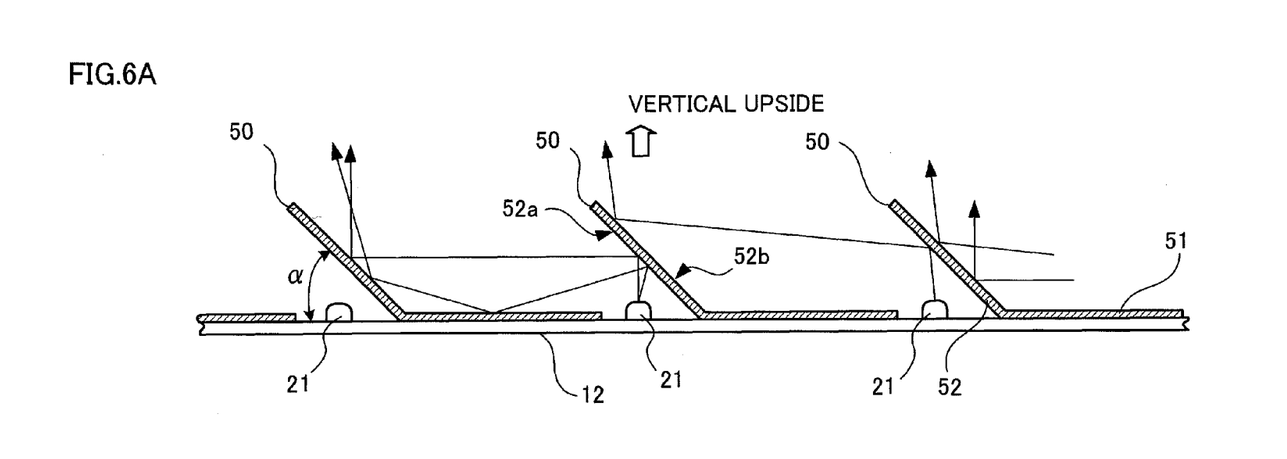
FIGS. 6A and 6B are partial sectional views each showing a state where the reflectors to which the exemplary embodiment is applied are mounted on the LED substrate.
Figure 6B:
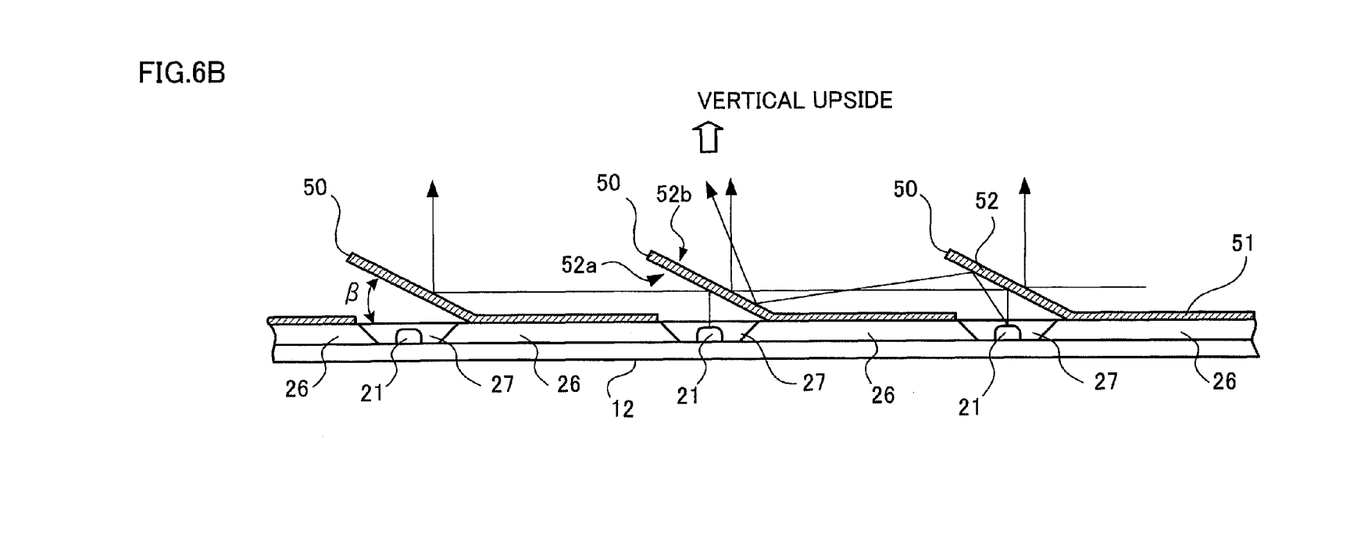

FIGS. 6A and 6B are partial sectional views each showing a state where the certain reflectors 50 are mounted on the LED substrate 12. FIG. 6A shows an example where the light-emitting diodes (LEDs) 21 are mounted in a protruding relation on the LED substrate 12 as shown in FIG. 3. FIG. 6B shows an example where a substrate laminated reflector 26 is formed on a surface of the LED substrate 12, and the light-emitting diodes (LEDs) 21 are disposed in an opening portion 27 of the substrate laminated reflector 26. Then, the opening portion 27 is filled with a transparent resin, after the mounting of the light-emitting diodes (LEDs) 21. The substrate laminated reflector 26 is made of, for example, a film made of resin such as white PET or a film formed by a plating deposition of metal such as silver or aluminum, or the like to impart a specular reflection or high-reflectivity function to the first and second surfaces.

In the instance shown in FIG. 6A, the light-emitting diodes (LEDs) 21 protrude from the surface of the LED substrate 12, and thus, a bending angle $\alpha$ of the bending portion 52 is relatively large. On the other hand, in the instance shown in FIG. 6B, the light-emitting diodes (LEDs) 21 are mounted in the opening portion 27 of the substrate laminated reflector 26 of the LED substrate 12 and thus, a bending angle $\beta$ of the bending portion 52 may be set small.

In the instances shown in FIGS. 6A and 6B, each of the mounting portions 51 of the reflector 50 is mounted directly on the surface of the LED substrate 12. Each of the bending portions 52 cut and bent up from the mounting portion 51 includes a first surface 52a and a second surface 52b having a front-rear relationship with the first surface 52a. In any of the instances shown in FIGS. 6A and 6B, when the light-emitting diodes (LEDs) 21 are arranged so as to emit light upward, provided that the LED substrate 12 is a horizontal surface, the bending portions 52 are located vertically above the light-emitting diodes (LEDs) 21, and the first surfaces 52a face the light-emitting diodes (LEDs) 21. Thereby, each of the first surfaces 52a directly reflects mainly light emitted from the light-emitting diode (LED) 21 directly under the first surface 52a. On the other hand, each of the second surfaces 52b reflects light emitted from the light-emitting diodes (LED) 21 adjacent to the light-emitting diode (LED) 21 directly under the second surface 52b and reflected by the first surfaces 52a of the adjacent reflectors 50, or the like. Reflection other than the above-mentioned reflection may possibly occur, depending on the bending angle of the reflector 50, diffraction of light, or the like; however, the above-mentioned reflection behavior is mainly obtained.

Figure 7:
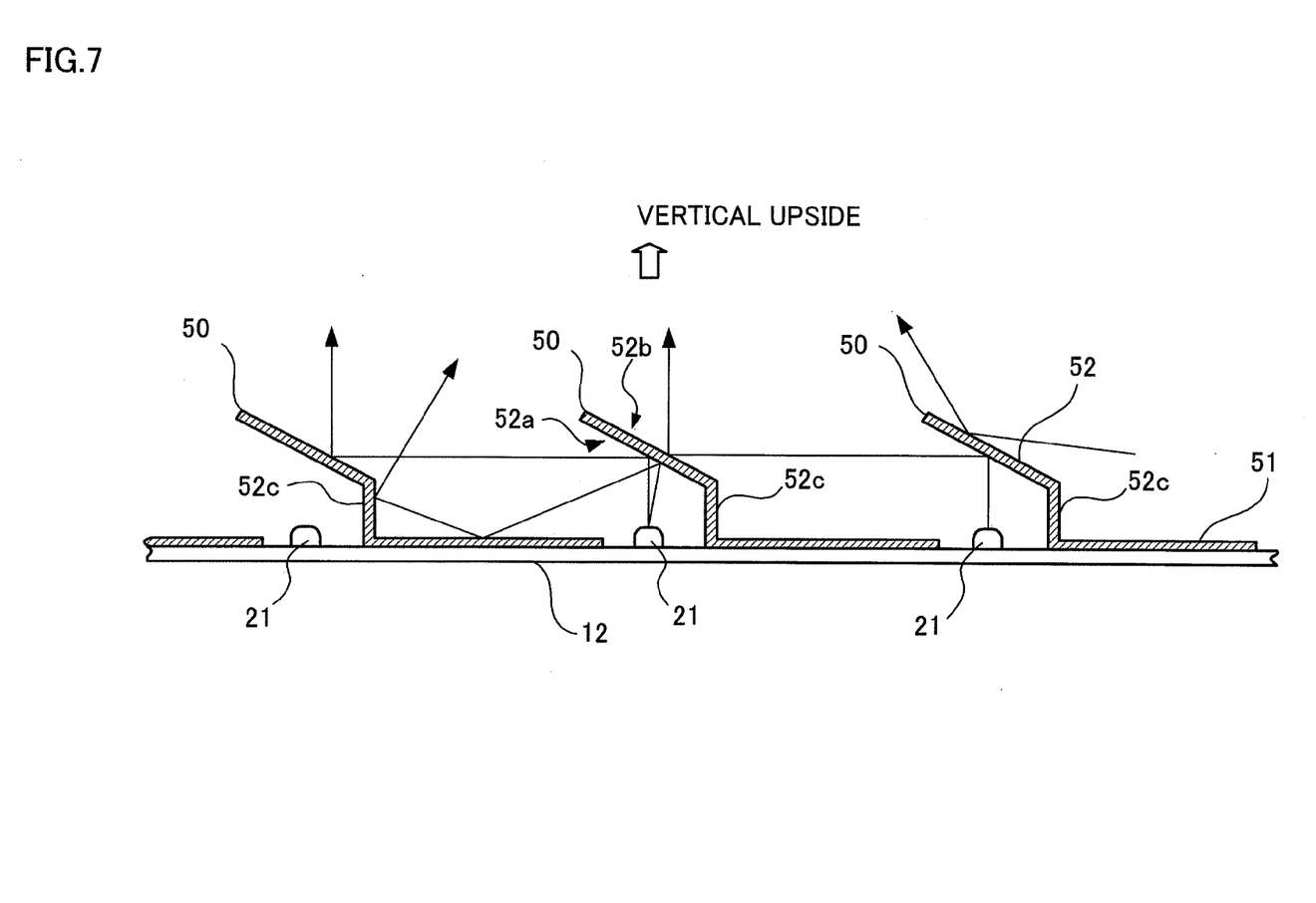
FIG. 7 is a view showing a modified example of the reflector to which the exemplary embodiment is applied.

FIG. 7 is a view showing a modified example of the reflector 50. Each of the reflectors 50 shown in FIG. 7 is provided with a middle portion 52c in the bending portion 52 bent from the mounting portion 51. A cross section of the middle portion 52c extends in vertical direction provided that the LED substrate 12 is a horizontal surface, or equivalently, extends vertically from the mounting portion 51. The middle portion 52c also has the above-mentioned first surface 52a and second surface 52b, and has the above-mentioned reflection function. Accordingly, light reflected by the middle portion 52c is also effectively utilized. The provision of the middle portion 52c increases degree of freedom of selecting the bending angle of the bending portions 52 in design, even if the light-emitting diodes (LEDs) 21 are mounted so as to protrude from the surface of the LED substrate 12.

Figure 8A:
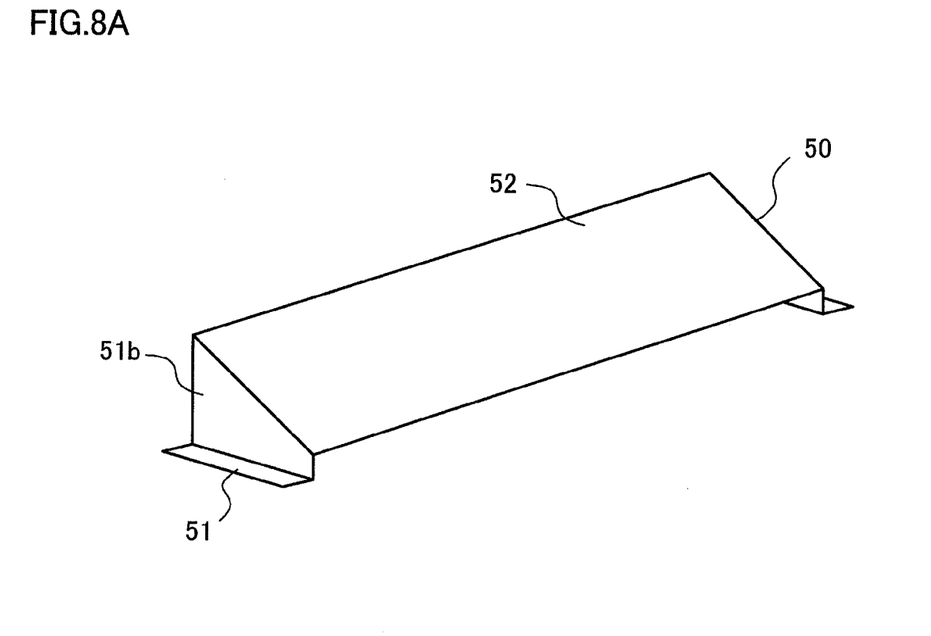
FIGS. 8A and 8B are views showing other modified examples of the reflector.
Figure 8B:
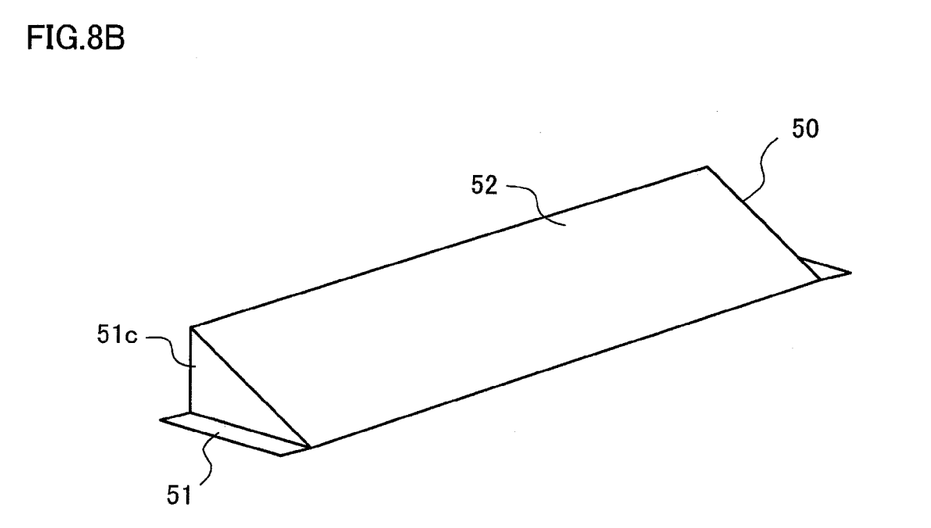

FIGS. 8A and 8B are views showing other modified examples of the reflector 50. In the instance shown in FIG. 8A, sidewall portions 51b formed by vertically bending the mounting portion 51 are provided on both sides (one of which is shown in FIG. 8A). In the present exemplary embodiment, the mounting portion 51 includes the sidewall portion 51b, and the bending portion 52 is bent from the sidewall portion 51b of the mounting portion 51. Likewise, in the instance shown in FIG. 8B, sidewall portions 51c formed by vertically bending the mounting portion 51 are provided on both sides (one of which is shown in FIG. 8B). In the present exemplary embodiment, the mounting portion 51 includes the sidewall portion 51c, and the bending portion 52 is bent from the sidewall portion 51c of the mounting portion 51. The instance shown in FIG. 8A is different from that shown in FIG. 8B in the shape of the sidewall portions 51b and 51c. In FIG. 8A, the reflector 50 is in a floating state as viewed only in cross section, while, in FIG. 8B, the bending portion 52 is formed continuously with the LED substrate 12 or the substrate laminated reflector 26.

Figure 9A:
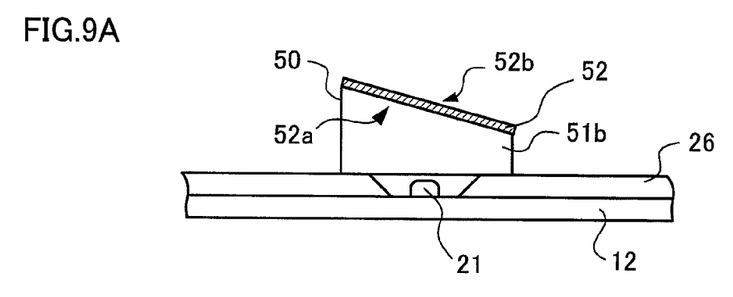
FIGS. 9A to 9D are views of assistance in each explaining a state where another modified example of the reflector is mounted on the LED substrate.
Figure 9B:
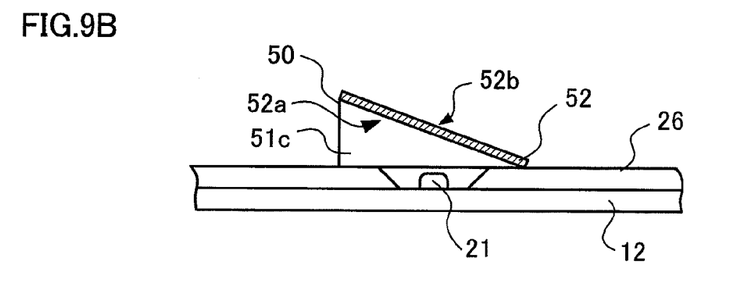

FIGS. 9A to 9D are views of assistance in each explaining a state where another modified example of the reflector 50 is mounted on the LED substrate 12, inclusive of the modified examples shown in FIGS. 8A and 8B. FIGS. 9A and 9B show partial sectional views of the modified examples in states where the reflectors 50 shown in FIGS. 8A and 8B are mounted on the LED substrates 12, respectively. The reflectors 50 are the same as described above in that each of the reflectors 50 has the first surface 52a and the second surface 52b, and has the function of reflecting light emitted from the light-emitting diodes (LEDs) 21.

Figure 9C:
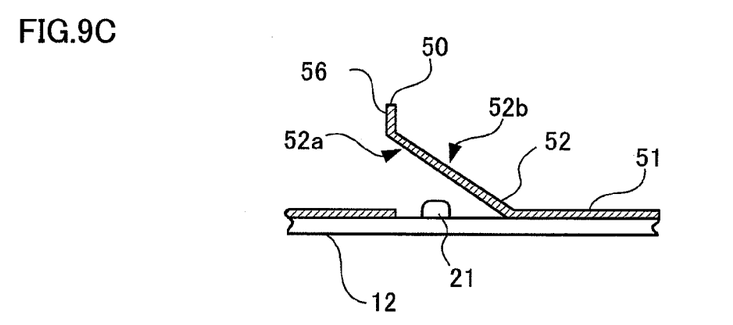
Figure 9D:
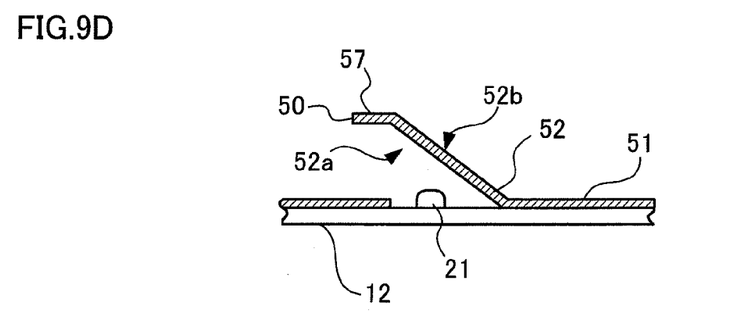

In FIGS. 9C and 9D, end bending portions 56 and 57 are provided on each end of the bending portions 52. Bending the bending portion 52 upward as shown in FIG. 9C is preferable in that the luminance is improved. Bending the bending portion 52 laterally as shown in FIG. 9D is excellent in that the degree of color mixing is improved. Also in these instances, the reflectors 50 are the same as described above in that each of the reflectors 50 has the first surface 52a and the second surface 52b, and has the function of reflecting light emitted from the light-emitting diodes (LEDs) 21.

Description will now be given with regard to functions of the light emitting device to which the present exemplary embodiment is applied. Incidentally, herein after, the terms "above" and "lateral" will be adopted, assuming the light-emitting diodes (LEDs) 21 are arranged to emit light upward provided that the LED substrate 12 is a horizontal surface, as shown in FIGS. 6A and 6B, regardless of the orientation of the light emitting device.

When a voltage is applied to the light-emitting diodes (LEDs) 21, light emitted from the light-emitting diodes (LEDs) 21 is guided to the first surface 52a of the bending portion 52, which is an inclined surface above, and is reflected, as shown, for example, by the arrows in FIGS. 6A and 6B. Then, the reflected light is dispersed in a lateral direction in FIGS. 6A and 6B.

The first surfaces 52a of the bending portions 52 are disposed above (vertically above) the light-emitting diodes (LEDs) 21, and thus, for example, if a liquid crystal display module 30 is disposed above in FIGS. 6A and 6B, light emitted from the light-emitting diodes (LEDs) 21 does not directly reach the liquid crystal display module 30. For example, if red, green and blue LEDs are used as the light-emitting diodes (LEDs) 21, lateral reflection increases the length of an optical path and thus yields adequate color mixing. As a result, good white light having little unevenness of color is provided to the liquid crystal display module 30.

As described in detail above, in the present exemplary embodiment, when the light-emitting diodes (LEDs) 21 are disposed to emit light upward provided that the LED substrate 12 is a horizontal surface, the use of the reflector 50 as mentioned above allows lateral reflection of light emitted upward from the light-emitting diodes (LEDs) 21. As a result, good color mixing is achieved, and also, the uniformity in the luminance and the thinner design of the light emitting device are achieved. Also, directly above the light source, the amount of light transmission can be reduced, and thus, when the light emitting device is used as the surface light source device or the like, the luminance directly above the light source can be reduced, thereby the nonuniformity in the luminance and the unevenness of color are suppressed.

Also, a light emitting device having high heat radiation characteristics and low cost can be provided, as compared to an instance where a reflecting film is formed on a light guide plate. Enhancement of this heat radiation effect permits improving response speed of the liquid crystal panel 31 (see FIG. 1), for example, when the light emitting device is used as the backlight for a liquid crystal display device such as a liquid crystal display. When the reflector 50 is made of a thin sheet (a thin film), weight reduction is achieved. Further, elimination of resin such as the light guide plate allows weight reduction. Also, collectively mounting the reflectors 50 by solder reflow or the like yields an improvement in assembly characteristics and thus achieves cost reduction.

DESCRIPTION OF REFERENCE NUMERALS AND SIGNS

10 . . . backlight device (backlight), 11 . . . backlight frame, 12 . . . LED substrate (mounting substrate), 13 . . . diffusion plate, 14, 15 . . . prism sheets, 21 . . . light-emitting diode (LED), 26 . . . substrate laminated reflector, 27 . . . opening portion, 30 . . . liquid crystal display module, 31 . . . liquid crystal panel, 32, 33 . . . polarization plates (polarization filters), 50 . . . reflector, 51 . . . mounting portion, 51b, 51c . . . sidewall portions, 52 . . . bending portion, 52a . . . first surface, 52b . . . second surface, 52c . . . middle portion, 56, 57 . . . end bending portions.

The invention claimed is:

1. A light emitting device comprising:
a mounting substrate;
a plurality of solid-state light-emitting elements that are mounted on the mounting substrate; and
a reflector that is mounted on the mounting substrate having a first surface and a second surface opposite to the first surface,
wherein said first surface reflects light emitted from one of the plurality of solid-state light-emitting elements, and
wherein said second surface reflects light emitted from another one of the plurality of solid-state light-emitting elements which is adjacent to the one of the plurality of solid-state light-emitting elements.

2. The light emitting device according to claim 1, wherein the reflector has a mounting portion for mounting the reflector so as to face a surface of the mounting substrate, and a bending portion that is bent from the mounting portion to form the first surface and the second surface.

3. The light emitting device according surface. to claim 2, wherein the reflector has the bending portion corresponding to each of the plurality of solid-state light-emitting elements.

4. The light emitting device according to claim 1, wherein the first surface of the reflector is disposed vertically above each of the plurality of solid-state light-emitting elements, when the mounting substrate is taken as a horizontal surface and the plurality of solid-state light-emitting elements is arranged so as to emit light upward.

5. A light emitting device, comprising:
a mounting substrate;
a solid-state light-emitting element that is mounted on the mounting substrate; and
a reflector that has a mounting portion for mounting the reflector to a surface of the mounting substrate so as to face the surface of the mounting substrate and a bending portion bent from the mounting portion and disposed in a location so as to directly receive and reflect light from the solid-state light-emitting element, and that reflects the light emitted from the solid-state light-emitting element,
wherein the surface of the mounting substrate extends in a horizontal direction,
wherein the mounting portion extends in the horizontal direction, and
wherein the bent portion extends at an angle from the horizontal direction.

6. The light emitting device according to claim 5, wherein the bending portion is formed by cutting and bending up a part of the reflector, the mounting portion is formed from an uncut part of the reflector, and the reflector is mounted on the surface of the mounting substrate directly or with a different material interposed in between.

7. The light emitting device according to claim 5, wherein the bending portion of the reflector has a first surface that directly receives and reflects light emitted from one of a plurality of the solid-state light-emitting elements, and a second surface that receives and reflects light emitted from another one of the plurality of solid-state light-emitting elements adjacent to the one of the plurality of solid-state light-emitting elements.

8. The light emitting device according to claim 5, wherein the bending portion of the reflector has a first surface that directly receives and reflects light emitted from solid-state light emitting elements in a first row of a plurality of the solid-state light-emitting elements, and a second surface that receives and reflects light emitted from solid-state light emitting elements in a second row in the plurality of solid-state light-emitting elements, the second row being adjacent to the first row.

9. A display device comprising:
a display panel that displays an image, and
a backlight that is disposed on a back side of the display panel and that irradiates the display panel with light from the back side of the display panel,
wherein the backlight includes:
a plurality of solid-state light-emitting elements; and
a reflector that has a first surface and a second surface opposite to the first surface,
wherein said first surface reflects light emitted from one of the plurality of solid-state light-emitting elements, and
wherein said second surface reflects light emitted from another one of the plurality of solid-state light-emitting elements which is adjacent to the one of the plurality of solid-state light-emitting elements.

10. The display device according to claim 9, wherein the reflector has a mounting portion for mounting the reflector so as to face a surface of the mounting substrate, and a bending portion that is bent from the mounting portion to form the first surface and the second surface.

11. The display device according to claim 10, wherein the reflector has the bending portion corresponding to each of the plurality of solid-state light-emitting elements.

12. The display device according to claim 9, wherein
the backlight further includes a mounting substrate on which the plurality of solid-state light-emitting elements is mounted, and
the reflector covers the solid-state light emitting elements at least in a vertical direction from a surface of the mounting substrate, and forms the first surface and the second surface at a certain angle with respect to any one of the surface of the mounting substrate and a plane parallel to the mounting substrate.

13. The display device according to claim 12, wherein the certain angle lies between 10 and 45 degrees inclusive.

14. The display device according to claim 9, wherein
the first surface and the second surface of the reflector are disposed corresponding to each of the plurality of solid-state light-emitting elements, and
the light reflected on the second surface is light emitted from the adjacent one of the plurality of solid-state light-emitting elements and reflected on a first surface of another reflector adjacent to the reflector.

15. The display device according to claim 9, wherein the first surface of the reflector directly receives and reflects light from solid-state light-emitting elements in a certain row of the plurality of solid-state light-emitting elements.

16. The light emitting device according to claim 1,
wherein the reflector is mounted on a surface of the mounting substrate which extends in a horizontal direction which is perpendicular to a vertical direction,
wherein the first surface reflects the light, emitted from one of the plurality of solid-state light-emitting elements, substantially in the horizontal direction, and
wherein the second surface reflects the light, emitted from the other of the plurality of solid-state light-emitting elements, substantially in the vertical direction.

17. The light emitting device according to claim 9,
wherein the reflector is mounted on a surface of a mounting substrate which extends in a horizontal direction which is perpendicular to a vertical direction,
wherein the first surface reflects the light, emitted from one of the plurality of solid-state light-emitting elements, substantially in the horizontal direction, and
wherein the second surface reflects the light, emitted from the other of the plurality of solid-state light-emitting elements, substantially in the vertical direction.

18. The light emitting device according to claim 1,
further comprising an adjacent reflector that is mounted on the mounting substrate and has an adjacent first surface and an adjacent second surface opposite the adjacent first surface,
wherein the adjacent first surface reflects light from the other of the plurality of solid-state light-emitting elements to the second surface of the reflector, and
wherein the adjacent second surface reflects light emitted from a third one of the plurality of solid-state light-emitting elements which is adjacent to the other of the plurality of solid-state light-emitting elements.

19. The light emitting device according to claim 1,
further comprising an adjacent reflector that has an adjacent first surface and an adjacent second surface opposite the adjacent first surface,
wherein the adjacent first surface reflects light from the other of the plurality of solid-state light-emitting elements to the second surface of the reflector, and
wherein the adjacent second surface reflects light emitted from a third one of the plurality of solid-state light-emitting elements which is adjacent to the other of the plurality of solid-state light-emitting elements.

* * * * *